United States Patent
Ueda et al.

(10) Patent No.: US 8,036,015 B2
(45) Date of Patent: Oct. 11, 2011

(54) RESISTIVE MEMORY

(75) Inventors: Yoshihiro Ueda, Yokohama (JP); Kenji Tsuchida, Kawasaki (JP); Kiyotaro Itagaki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 142 days.

(21) Appl. No.: 12/536,341

(22) Filed: Aug. 5, 2009

(65) Prior Publication Data

US 2010/0165701 A1    Jul. 1, 2010

(30) Foreign Application Priority Data

Aug. 22, 2008  (JP) ................. 2008-213671

(51) Int. Cl.
*G11C 11/00* (2006.01)
*G11C 7/10* (2006.01)

(52) U.S. Cl. ........................ 365/148; 365/158
(58) Field of Classification Search .......... 365/148, 365/158, 163, 189.05
See application file for complete search history.

(56) References Cited

U.S. PATENT DOCUMENTS

| | | | |
|---|---|---|---|
| 6,707,710 B1 | 3/2004 | Holden | |
| 6,721,198 B2 | 4/2004 | Kang | |
| 6,781,873 B2 | 8/2004 | Ishikawa et al. | |
| 6,809,976 B2 | 10/2004 | Ooishi | |
| 6,853,599 B2 * | 2/2005 | Oh et al. ................ | 365/158 |
| 6,982,908 B2 * | 1/2006 | Cho ........................ | 365/158 |
| 7,221,585 B2 | 5/2007 | Bessho | |
| 7,813,166 B2 * | 10/2010 | Jung et al. ............... | 365/158 |
| 2002/0154531 A1 | 10/2002 | Lowrey et al. | |
| 2004/0047216 A1 | 3/2004 | Ishikawa et al. | |
| 2008/0002483 A1 | 1/2008 | Rinerson et al. | |
| 2008/0158936 A1 | 7/2008 | Bertin et al. | |
| 2008/0310241 A1 * | 12/2008 | Sakoh .................... | 365/189.07 |
| 2008/0315335 A1 | 12/2008 | Ueda | |

FOREIGN PATENT DOCUMENTS

JP    2004-103060 A    4/2004

OTHER PUBLICATIONS

Background Art Information.
U.S. Appl. No. 12/543,793, filed Oct. 26, 2004, Ooishi.

* cited by examiner

*Primary Examiner* — Anh Phung
(74) *Attorney, Agent, or Firm* — Knobbe, Martens, Olson & Bear LLP

(57) ABSTRACT

A resistive memory includes a plurality of memory cells, a plurality of reference cells having mutually different resistance values, at least one sense amplifier having a first input terminal connected to one selected memory cell which is selected from the plurality of memory cells at a time of read, and a second input terminal connected to one selected reference cell which is selected from the plurality of reference cells at the time of read, and one latch circuit which holds offset information of the at least one sense amplifier. The resistive memory further includes a decoder which selects, in accordance with the offset information, the one selected reference cell from the plurality of reference cells, and connects the one selected reference cell to the second input terminal of the at least one sense amplifier.

18 Claims, 3 Drawing Sheets

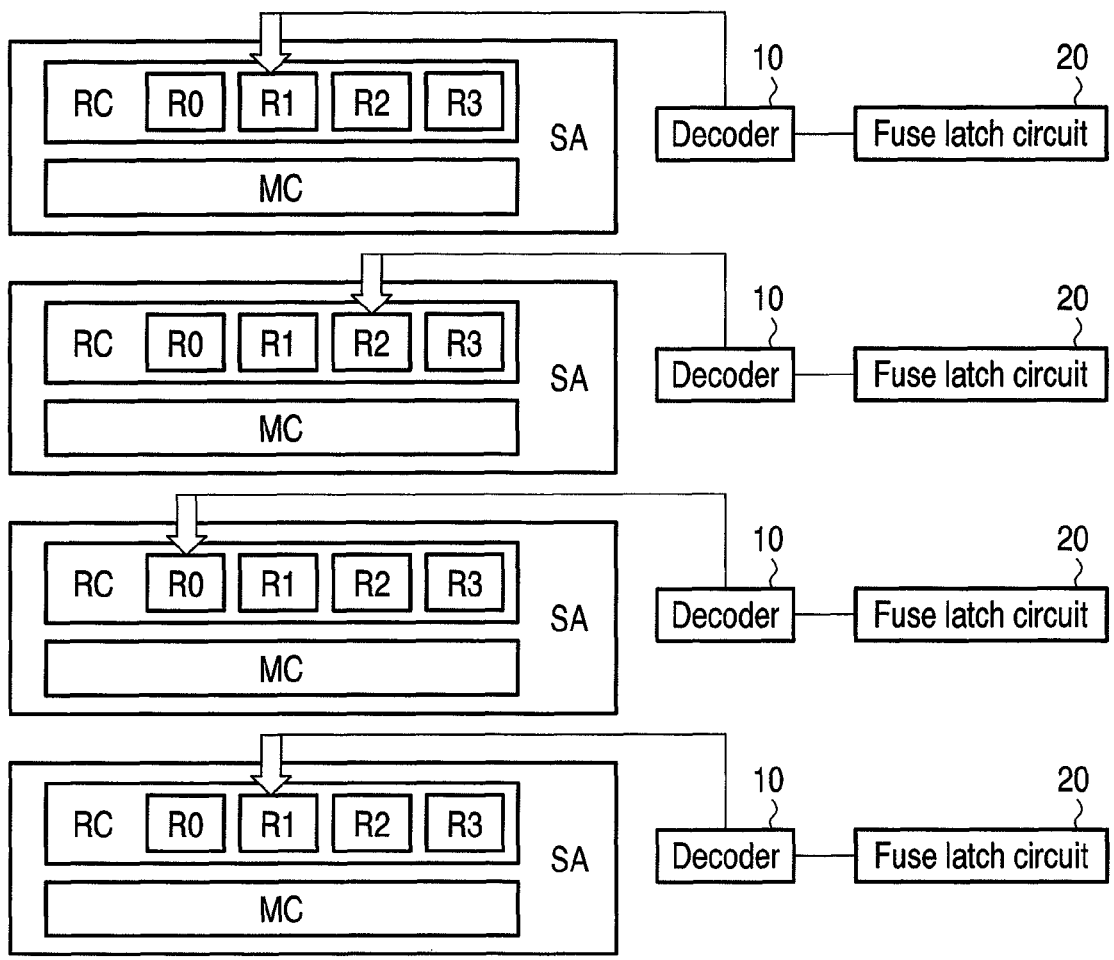
F I G. 1

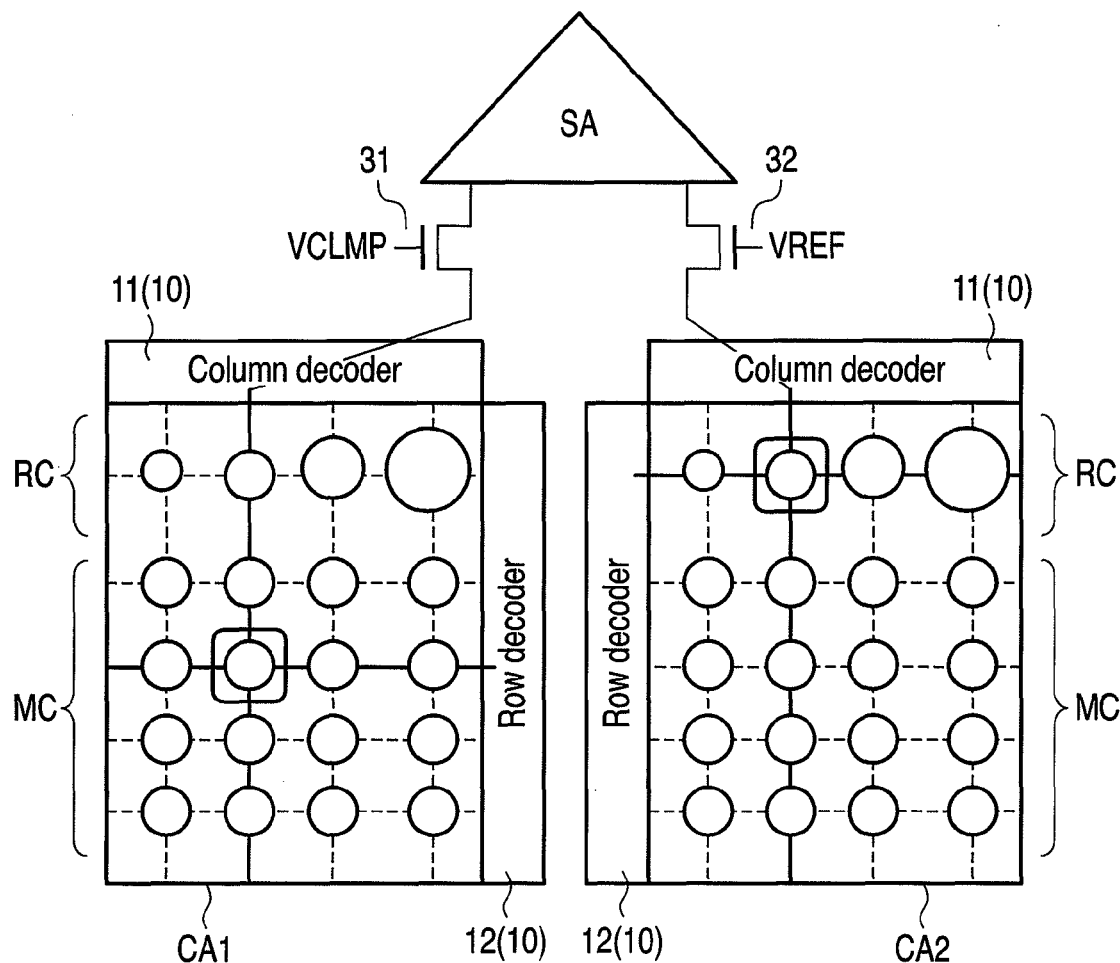
F I G. 2
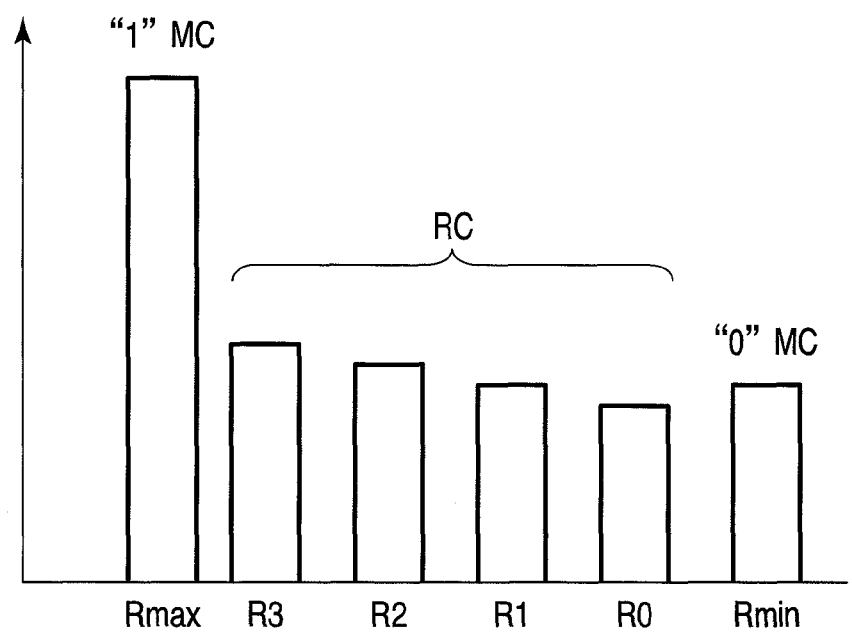
F I G. 3

RESISTIVE MEMORY

CROSS-REFERENCE TO RELATED APPLICATIONS

This application is based upon and claims the benefit of priority from prior Japanese Patent Application No. 2008-213671, filed Aug. 22, 2008, the entire contents of which are incorporated herein by reference.

BACKGROUND OF THE INVENTION

1. Field of the Invention

The present invention relates to a resistive memory. The invention relates more particularly to a resistive memory including a plurality of reference cells having mutually different resistance values.

2. Description of the Related Art

As resistive memories, there are known an MRAM (Magnetoresistive Random Access Memory), a PRAM (Phase-Change Random Access Memory), and a ReRAM (Resistance Random Access Memory). The feature of the resistive memory is that information is stored by a change in resistance value (resistance state) of a memory element. The resistance state of the memory element is determined by a sense amplifier. Specifically, at a time of an information read-out operation, a read current flowing in the memory element and a reference current flowing in a reference element are compared by a sense amplifier, thereby determining the resistance state of the memory element.

In the conventional resistive memory, however, there is a problem that the read-out characteristics deteriorate due to variance in input offset of the sense amplifier (see, for example, U.S. Pat. No. 6,809,976 or U.S. Pat. No. 6,707,710).

BRIEF SUMMARY OF THE INVENTION

According to a first aspect of the present invention, there is provided a resistive memory comprising: a plurality of memory cells; a plurality of reference cells having mutually different resistance values; at least one sense amplifier having a first input terminal connected to one selected memory cell which is selected from the plurality of memory cells at a time of read, and a second input terminal connected to one selected reference cell which is selected from the plurality of reference cells at the time of read; one latch circuit which holds offset information of the at least one sense amplifier; and a decoder which selects, in accordance with the offset information, the one selected reference cell from the plurality of reference cells, and connects the one selected reference cell to the second input terminal of the at least one sense amplifier.

According to a second aspect of the present invention, there is provided a resistive memory comprising: a plurality of sense amplifiers each having one input terminal and the other input terminal; a plurality of memory cell arrays which are provided in association with the plurality of sense amplifiers, respectively, the plurality of memory cell arrays including one array and the other array, the one array including a plurality of first memory cells and a plurality of first reference cells having mutually different resistance values, and the other array including a plurality of second memory cells and a plurality of second reference cells having mutually different resistance values; a plurality of latch circuits which hold offset information of the plurality of sense amplifiers; and a plurality of decoders which connect, at a time of read, one selected memory cell which is selected from the plurality of first memory cells of the one array, to the one input terminal of an associated one of the plurality of sense amplifiers, and connects, one selected reference cell which is selected from the plurality of second reference cells of the other array in accordance with the offset information, to the other input terminal of the associated one of the plurality of sense amplifiers.

BRIEF DESCRIPTION OF THE SEVERAL VIEWS OF THE DRAWING

FIG. 1 is a block diagram showing a structure example of a resistive memory according to a first embodiment of the present invention;

FIG. 2 is a circuit diagram showing a part of the structure of the resistive memory;

FIG. 3 shows examples of resistance values of reference cells in the resistive memory;

DETAILED DESCRIPTION OF THE INVENTION

Figure 4:
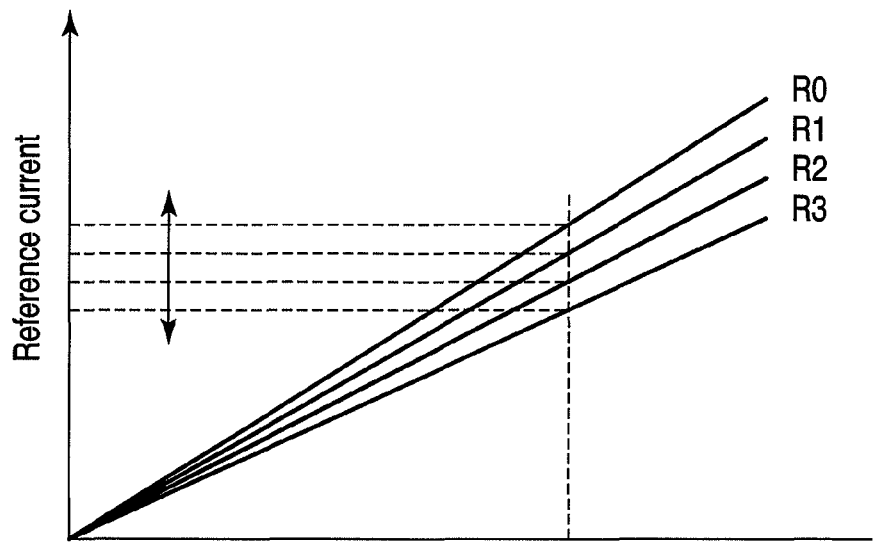
FIG. 4 is a graph for explaining the relationship between resistance values and reference currents of reference cells.

Embodiments of the present invention will be described with reference to the accompanying drawings. It should be noted that the drawings are schematic ones and so are not to scale. The following embodiments are directed to a device and a method for embodying the technical concept of the present invention and the technical concept does not specify the material, shape, structure or configuration of components of the present invention. Various changes and modifications can be made to the technical concept without departing from the scope of the claimed invention.

First Embodiment

[1] Circuit Configuration

FIG. 1 shows a structure example of a resistive memory according to a first embodiment of the present invention. The entire structure of the resistive memory is described below.

As is shown in FIG. 1, the resistive memory includes memory cells MC, reference cells RC, sense amplifiers SA, decoders 10 and fuse latch circuits 20.

There are provided plural memory cells MC and plural reference cells RC, which constitute a plurality of cell arrays (CA). The plural reference cells RC have mutually different resistance values R (R0, R1, R2 and R3 in the present example).

The sense amplifiers SA are provided in association with the respective cell arrays. A selected one of the plural memory cells MC is connected to a first input terminal of each sense amplifier SA. A selected one of the plural reference cells RC is connected to a second input terminal of each sense amplifier SA. The sense amplifier SA compares a read current flowing in the selected memory cell MC and a reference current flowing in the selected reference cell RC, thereby determining the resistance state of the memory cell MC.

The fuse latch circuits 20 are provided in association with the respective sense amplifiers SA. An input offset due to variance in fabrication is present in each sense amplifier SA. The fuse latch circuit 20 holds input offset information of the associated sense amplifier SA. This input offset information is set by a fuse program on the basis of a result of a test which is conducted after chip fabrication in order to select the optimal reference cell RC for each sense amplifier SA. The input offset information is written after the chip fabrication, and is held in the fuse latch circuit 20 semipermanently. The fuse latch circuit 20 is composed of, e.g. a nonvolatile memory which can hold data even after power-off.

The decoder 10 selects a memory dell MC, and a reference cell RC having a resistance value R0, R1, R2, R3 for correcting the input offset of each sense amplifier SA, on the basis of the input offset information which is held in the fuse latch circuit 20.

Specifically, in the case of the example of FIG. 1, input offset information is set in the fuse latch circuit 20 corresponding to the uppermost-stage sense amplifier SA so that the reference cell RC having the resistance value R1, which corrects the input offset of the sense amplifier SA, may be selected by the decoder 10. Similarly, input offset information is set in the fuse latch circuit 20 corresponding to the second-stage sense amplifier SA so that the reference cell RC having the resistance value R2, for example, may be selected. Input offset information is set in the fuse latch circuit 20 corresponding to the third-stage sense amplifier SA so that the reference cell RC having the resistance value R0, for example, may be selected. Input offset information is set in the fuse latch circuit 20 corresponding to the fourth-stage sense amplifier SA so that the reference cell RC having the resistance value R1, for example, may be selected.

FIG. 2 shows the structure of the resistive memory in greater detail. In the description below, a part of the resistive memory is described by way of example.

As shown in FIG. 2, a first cell array CA1 is connected to a first input terminal of the sense amplifier SA via a first transistor 31. A second cell array CA2 is connected to a second input terminal of the sense amplifier SA via a second transistor 32. The first and second transistors 31 and 32 are composed of, for example, source-follower-connected NMOS transistors. A voltage VCLMP is applied to the gate of the first transistor 31 from a control unit (not shown), and a voltage VREF is applied to the gate of the second transistor 32 from the control unit.

Decoders 10 are disposed on peripheral parts of the first and second cell arrays CA1 and CA2. The decoders 10 include column decoders 11 and row decoders 12. Each cell in the first and second cell arrays CA1 and CA2 is selected by the column decoder 11 and row decoder 12.

In the first and second cell arrays CA1 and CA2, a plurality of memory cells MC and a plurality of reference cells RC are disposed. The memory cell MC and reference cell RC have the same cell structure.

The plural reference cells RC have mutually different resistance values R. In the case of the present example, different values R are realized by varying the cell areas. Specifically, the area in plan shape of the resistive element, which constitutes the reference cell RC, is varied in accordance with the resistance value R.

The plural reference cells RC in the first cell array CA1 and the plural reference cells RC in the second cell array CA2 should preferably have the same variations of resistance values R. This aims at performing offset adjustment in the same manner even if the reference cell RC is selected from either the first cell array CA1 or the second cell array CA2 at the time of the information read operation.

[2] Read

Referring now to FIG. 1 and FIG. 2, an information read operation in the present embodiment is described. In this embodiment, for example, a description is given of the case in which the memory cell MC is selected from the first cell array CA1 in FIG. 2, and the reference cell RC is selected from the second cell array CA2. Needless to say, the memory cell MC may be selected from the second cell array CA2, and the reference cell RC may be selected from the first cell array CA1.

To begin with, prior to starting the information read operation, input offset information for each sense amplifier SA is set in the fuse latch circuit 20 in advance. This input offset information is set, for example, by fuse-cutting on the basis of a result of a test which is conducted after chip fabrication in order to select the optimal reference cell RC for each sense amplifier SA.

One memory cell MC is selected from the first cell array CA1 by the column decoder 11 and row decoder 12 on the first cell array CA1 side. On the other hand, on the basis of the input offset information for each sense amplifier SA, which is held by the fuse latch circuit 20, one reference cell RC having a predetermined resistance value R is selected from the second cell array CA2 by the column decoder 11 and row decoder 12 on the second cell array CA2 side. The selected memory cell MC is connected to the first input terminal of the sense amplifier SA, and the selected reference cell RC is connected to the second input terminal of the sense amplifier SA.

At this time, the voltage of the memory cell MC is set in the neighborhood of "VCLMP—threshold voltage" by the gate voltage VCLMP of the first transistor 31. On the other hand, the voltage of the reference cell RC is set in the neighborhood of "VREF—threshold voltage" by the gate voltage VREF of the second transistor 32. The gate voltage VREF is set such that the reference current takes an intermediate value between "0" and "1" of the read current. The gate voltage VCLMP that is supplied to the memory cell MC and the gate voltage VREF that is supplied to the reference cell RC may be equal or may be different.

The sense amplifier SA compares the read current flowing in the memory cell MC and the reference current flowing in the reference cell RC, and determines the resistance state of the memory cell MC. Read with high precision is realized by the current comparison according to the differential method using the reference cell RC.

Since the cell having the resistance value R for correcting the input offset of each sense amplifier SA is selected as the reference cell RC, the same reference cell RC is always selected for the corresponding sense amplifier SA at the time of the information read operation. It is possible, however, to make such a modification that an auxiliary reference cell may be selected.

[3] Reference Cell

Referring to FIG. 3 and FIG. 4, the reference cells RC according to the present embodiment are described.

As shown in FIG. 3, the resistance values R0, R1, R2 and R3 of the plural reference cells RC are slightly varied stepwise from each other. The resistance values R0, R1, R2 and R3 of the reference cells RC may be varied in this manner, for example, by varying the areas of the resistive elements, as shown in FIG. 2 schematically.

The resistance values R of the plural reference cells RC fall in a range between a resistance value Rmax of the memory cell MC in a high resistance state (e.g. "1" state) and a resistance value Rmin of the memory cell MC in a low resistance state (e.g. "0" state). The resistance values R0, R1, R2 and R3 of the plural reference cells RC are varied with reference to the resistance value of one of the resistance states of the memory cell MC (in FIG. 3, the resistance value Rmin of the low resistance state), for example, in units of 1/100 of the resistance value Rmin.

Accordingly, as shown in FIG. 4, at the time of the information read operation, the reference current can be slightly varied by adjusting the reference cell voltage of the reference cell RC. As the resistance value R0, R1, R2, R3 of the reference cell RC is smaller, the value of the reference current can be made higher. Thereby, the input offset of the sense amplifier SA due to fabrication variance can be corrected.

[4] Memory Cell

Figure 5:
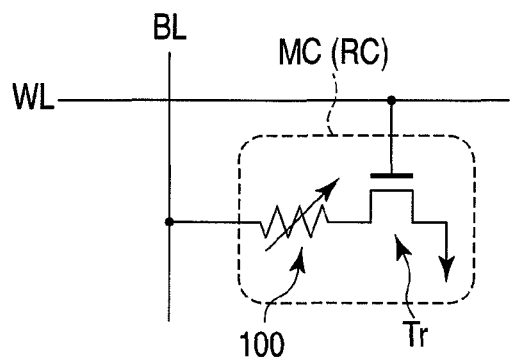
FIG. 5 is a circuit diagram showing a structure example of a memory cell in the resistive memory.
Figure 6:
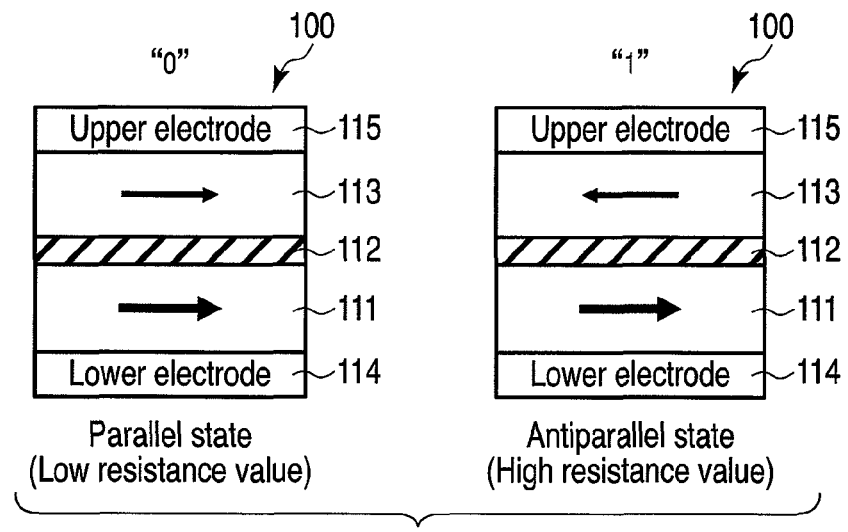
FIG. 6 is cross-sectional views showing a structure example of a magnetoresistive element which constitutes a memory cell.

Referring to FIG. 5 and FIG. 6, the memory cell according to the present embodiment is described. In this embodiment, an MRAM using a magnetoresistive element (resistive element) is described by way of example. The reference cell RC has the same structure as the memory cell MC.

As shown in FIG. 5, the memory cell MC includes a magnetoresistive element 100 and a select transistor Tr. One end of the magnetoresistive element 100 is connected to one end of the current path of the select transistor Tr, and the magnetoresistive element 100 and select transistor Tr are connected in series. The other end of the magnetoresistive element 100 is connected to the bit line BL. The gate of the select transistor Tr is connected to the word line WL which extends perpendicular to the bit line BL. The bit line BL is selected by the column decoder 11, and the word line WL is selected by the row decoder 12.

The memory cells MC are arranged in a matrix, and constitute a memory cell array. A specified memory cell MC is selected in accordance with an address signal which is input from the outside, and read and write are executed.

As shown in FIG. 6, the magnetoresistive element 100 is configured such that a nonmagnetic layer 112 is vertically sandwiched between two magnetic layers 111 and 113. When the magnetization directions of the two magnetic layers 111 and 113 are parallel, the magnetoresistive element 100 is in a low resistance state (e.g. "0" state). On the other hand, when the magnetization directions of the two magnetic layers 111 and 113 are antiparallel, the magnetoresistive element 100 is in a high resistance state (e.g. "1" state). A lower electrode 114 is provided under the magnetic layer 111, and an upper electrode 115 is provided over the magnetic layer 113.

The resistance state of the magnetoresistive element 100 is determined by causing a read current to flow, as described above. The magnetization directions of the magnetic layers 111 and 113 are controlled by making use of spin torque transfer in accordance with the direction of write current.

The present embodiment is also applicable to a PRAM and a ReRAM, which are resistive memories. In the case of the PRAM, a chalcogenide element may be used as the resistive element. In the case of the ReRAM, a transition metal oxide element may be used as the resistive element.

[5] Advantageous Effect

According to the first embodiment of the present invention, a plurality of cells having mutually different resistance values are prepared as reference cells RC, and input offset information for the respective sense amplifiers SA is held in the fuse latch circuits 20. At the time of the information read operation, on the basis of the input offset information of the fuse latch circuit 20, the reference cell RC, which has such a resistance value as to correct the input offset of the sense amplifier SA, is selected, and the input offset of the sense amplifier SA is corrected. Thereby, the information, which is stored in the memory cell MC, can be read with high precision.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A resistive memory comprising:
a plurality of memory cells;
a plurality of reference cells having mutually different resistance values;
at least one sense amplifier having a first input terminal connected to one selected memory cell which is selected from the plurality of memory cells at a time of read, and a second input terminal connected to one selected reference cell which is selected from the plurality of reference cells at the time of read;
one latch circuit which holds offset information of the at least one sense amplifier; and
a decoder which selects, in accordance with the offset information, the one selected reference cell from the plurality of reference cells, and connects the one selected reference cell to the second input terminal of the at least one sense amplifier.

2. The resistive memory according to claim 1, wherein the plurality of memory cells and the plurality of reference cells include resistive elements, respectively.

3. The resistive memory according to claim 2, wherein the resistive elements in the plurality of reference cells have mutually different areas.

4. The resistive memory according to claim 2, wherein the resistive element is a magnetoresistive element.

5. The resistive memory according to claim 2, wherein the resistive element is a chalcogenide element.

6. The resistive memory according to claim 2, wherein the resistive element is a transition metal oxide element.

7. The resistive memory according to claim 1, wherein the one latch circuit includes a nonvolatile memory.

8. The resistive memory according to claim 1, wherein the resistance values of the plurality of reference cells are varied with reference to a resistance value in one resistance state of the plurality of memory cells.

9. The resistive memory according to claim 1, wherein different voltages are supplied to the selected one memory cell and to the selected one reference cell.

10. A resistive memory comprising:
a plurality of sense amplifiers each having one input terminal and the other input terminal;
a plurality of memory cell arrays which are provided in association with the plurality of sense amplifiers, respectively, the plurality of memory cell arrays including one array and the other array, the one array including a plurality of first memory cells and a plurality of first reference cells having mutually different resistance values, and the other array including a plurality of second memory cells and a plurality of second reference cells having mutually different resistance values;
a plurality of latch circuits which hold offset information of the plurality of sense amplifiers; and
a plurality of decoders which connect, at a time of read, one selected memory cell which is selected from the plurality of first memory cells of the one array, to the one input terminal of an associated one of the plurality of sense amplifiers, and connects, one selected reference cell which is selected from the plurality of second reference cells of the other array in accordance with the offset information, to the other input terminal of the associated one of the plurality of sense amplifiers.

11. The resistive memory according to claim 10, wherein the plurality of first memory cells, the plurality of second memory cells, the plurality of first reference cells and the plurality of second reference cells include resistive elements, respectively.

12. The resistive memory according to claim 11, wherein the resistive elements in the plurality of first reference cells have mutually different areas, and the resistive elements in the plurality of second reference cells have mutually different areas.

13. The resistive memory according to claim 11, wherein the resistive element is a magnetoresistive element.

14. The resistive memory according to claim 11, wherein the resistive element is a chalcogenide element.

15. The resistive memory according to claim 11, wherein the resistive element is a transition metal oxide element.

16. The resistive memory according to claim 10, wherein each of the plurality of latch circuits includes a nonvolatile memory.

17. The resistive memory according to claim 10, wherein the resistance values of the plurality of first reference cells are varied with reference to a resistance value in one resistance state of the plurality of first memory cells, and the resistance values of the plurality of second reference cells are varied with reference to a resistance value in one resistance state of the plurality of second memory cells.

18. The resistive memory according to claim 10, wherein different voltages are supplied to the selected one memory cell and to the selected one reference cell.

* * * * *